United States Patent
Somervell et al.

(10) Patent No.: US 9,147,574 B2
(45) Date of Patent: Sep. 29, 2015

(54) TOPOGRAPHY MINIMIZATION OF NEUTRAL LAYER OVERCOATS IN DIRECTED SELF-ASSEMBLY APPLICATIONS

(71) Applicant: Tokyo Electron Limited, Tokyo (JP)

(72) Inventors: Mark H. Somervell, Austin, TX (US); Benjamen M. Rathsack, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 14/208,130

(22) Filed: Mar. 13, 2014

(65) Prior Publication Data
US 2014/0273514 A1 Sep. 18, 2014

Related U.S. Application Data

(60) Provisional application No. 61/782,518, filed on Mar. 14, 2013.

(51) Int. Cl.
*H01L 21/02* (2006.01)
*H01L 21/027* (2006.01)
*C23C 16/455* (2006.01)
(Continued)

(52) U.S. Cl.
CPC .......... *H01L 21/0271* (2013.01); *B82Y 10/00* (2013.01); *B82Y 40/00* (2013.01); *C23C 14/221* (2013.01); *C23C 16/45525* (2013.01); *G03F 7/0002* (2013.01); *G03F 7/40* (2013.01);
(Continued)

(58) Field of Classification Search
None
See application file for complete search history.

(56) References Cited

U.S. PATENT DOCUMENTS 5,344,742 A 9/1994 Sinta et al.
5,650,261 A 7/1997 Winkle
(Continued)

FOREIGN PATENT DOCUMENTS

DE 102012105384 A1 9/2012
KR 20120133272 A 12/2012
(Continued)

OTHER PUBLICATIONS

Liu et al., "Integration of Block Copolymer Directed Assembly with 193 Immersion Lithography" American Vacuum Society, J. Vac. Sci. Technol. B 28(6), Nov./Dec. 2010, 5 pp.
(Continued)

*Primary Examiner* — Scott B Geyer
(74) *Attorney, Agent, or Firm* — Wood, Herron & Evans, LLP (57) ABSTRACT

A method is provided for patterning a layered substrate that includes loading a substrate into a coater-developer processing system; coating the substrate with a photoresist material layer; patterning the photoresist material layer to form a photoresist pattern; transferring the substrate to a deposition processing system; and depositing a neutral layer over the photoresist pattern and exposed portions of the substrate. The neutral layer can deposited using a gas cluster ion beam (GCIB) process, or an atomic layer deposition (ALD) process, which has minimal topography. The method may further include lifting off a portion of the neutral layer deposited over the photoresist pattern to expose a neutral layer template for subsequent directed self-assembly (DSA) patterning; depositing a DSA material layer over the neutral layer template; baking the DSA material layer to form a DSA pattern; and developing the DSA material layer to expose the final DSA pattern for subsequent feature etching.

20 Claims, 5 Drawing Sheets

(51) Int. Cl.

| | |
|---|---|
| G03F 7/00 | (2006.01) |
| G03F 7/40 | (2006.01) |
| H01J 37/317 | (2006.01) |
| C23C 14/22 | (2006.01) |
| B82Y 10/00 | (2011.01) |
| B82Y 40/00 | (2011.01) |

(52) U.S. Cl.
CPC ............... *G03F 7/405* (2013.01); *H01J 37/317* (2013.01); *H01L 21/0272* (2013.01)

(56) References Cited

U.S. PATENT DOCUMENTS

| | | |
|---|---|---|
| 6,303,477 B1 | 10/2001 | Ianovitch |
| 6,855,476 B2 | 2/2005 | Ferreira et al. |
| 7,521,094 B1 | 4/2009 | Cheng et al. |
| 7,579,278 B2 | 8/2009 | Sandhu |
| 7,687,220 B2 | 3/2010 | Yamato et al. |
| 7,723,009 B2 | 5/2010 | Sandhu et al. |
| 7,754,518 B2 | 7/2010 | Koelmel et al. |
| 7,923,373 B2 | 4/2011 | Sandhu |
| 8,039,196 B2 | 10/2011 | Kim et al. |
| 8,083,953 B2 | 12/2011 | Millward et al. |
| 8,241,822 B2 | 8/2012 | Yamato et al. |
| 8,420,304 B2 | 4/2013 | Inatomi |
| 8,603,867 B2 | 12/2013 | Kim et al. |
| 2002/0192619 A1 | 12/2002 | Besek |
| 2002/0193619 A1 | 12/2002 | Crivello et al. |
| 2003/0084925 A1 | 5/2003 | Nakajima et al. |
| 2005/0056219 A1 | 3/2005 | Dip et al. |
| 2005/0215713 A1 | 9/2005 | Hessell et al. |
| 2006/0123658 A1 | 6/2006 | Izumi |
| 2006/0251989 A1 | 11/2006 | Breyta et al. |
| 2007/0037412 A1 | 2/2007 | Dip et al. |
| 2007/0184656 A1* | 8/2007 | Sherman et al. ............... 438/687 |
| 2007/0224823 A1 | 9/2007 | Sandhu |
| 2007/0237697 A1 | 10/2007 | Clark |
| 2007/0238028 A1 | 10/2007 | Inatomi |
| 2008/0193658 A1 | 8/2008 | Millward |
| 2008/0311402 A1 | 12/2008 | Jung et al. |
| 2008/0318005 A1 | 12/2008 | Millward |
| 2009/0081827 A1 | 3/2009 | Yang et al. |
| 2009/0087664 A1 | 4/2009 | Nealey et al. |
| 2009/0181171 A1 | 7/2009 | Cheng et al. |
| 2009/0200646 A1 | 8/2009 | Millward et al. |
| 2009/0236309 A1 | 9/2009 | Millward et al. |
| 2009/0291398 A1 | 11/2009 | Horiuchi |
| 2010/0055621 A1 | 3/2010 | Hatakeyama et al. |
| 2010/0193898 A1* | 8/2010 | Hautala et al. ............... 257/506 |
| 2010/0200774 A1* | 8/2010 | Burke et al. ............. 250/492.21 |
| 2010/0227276 A1 | 9/2010 | Mizuno |
| 2011/0033786 A1 | 2/2011 | Sandhu |
| 2011/0059299 A1 | 3/2011 | Kim et al. |
| 2011/0147984 A1 | 6/2011 | Cheng et al. |
| 2011/0147985 A1 | 6/2011 | Cheng et al. |
| 2011/0229120 A1 | 9/2011 | Takaki et al. |
| 2011/0272381 A1 | 11/2011 | Millward et al. |
| 2012/0046415 A1 | 2/2012 | Millward et al. |
| 2012/0046421 A1 | 2/2012 | Darling et al. |
| 2012/0077127 A1 | 3/2012 | Sills et al. |
| 2012/0088192 A1 | 4/2012 | Trefonas et al. |
| 2013/0189504 A1 | 7/2013 | Nealey et al. |
| 2013/0292805 A1* | 11/2013 | Cai et al. ........................ 257/622 |
| 2014/0061154 A1 | 3/2014 | Kim et al. |
| 2014/0099583 A1 | 4/2014 | Holmes et al. |
| 2014/0154630 A1 | 6/2014 | Schmid et al. |

FOREIGN PATENT DOCUMENTS

| | | |
|---|---|---|
| WO | 03016209 A1 | 2/2003 |
| WO | 2012071330 A1 | 5/2012 |
| WO | 2012084558 A1 | 6/2012 |
| WO | 2012175342 A2 | 12/2012 |
| WO | 2012175343 A1 | 12/2012 |
| WO | 2013010730 A1 | 1/2013 |

OTHER PUBLICATIONS

Bielawski et al., "Regiospecific One-Pot Synthesis of Diaryliodonium Tetrafluoroborates from Arylboronic Acids and Aryl Iodides," J. Org. Chem. 73:4602-4607, 2008.

Cheng et al., "Developing Directly Photodefinable Substrate Guiding Layers for Block Copolymer Directed Self-Assembly (DSA) Patterning," Proc. of SPIE. 7972:79722I(1)-79722I(13), 2011.

Cheng et al., "Simple and Versatile Methods to Integrate Directed Self-Assembly with Optical Lithography Using a Polarity-Switched Photoresist," ACS Nano, 4(8):4815-4823, 2010.

Cheng, et al., "EUVL Compatible, LER Solutions using Functional Block Copolymers," Alternative Lithographic Technologies IV, Proc. of SPIE, vol. 8323, 2012, 11 pp.

Cho et al., "Polymer Bound Photobase Generators and Photoacid Generators for Pitch Division Lithography," Proc. of SPIE. 7972:797221(1)-797221(8), 2011.

Cupta, "Photoacid Generators for Catalytic Decomposition of Polycarbonate," Thesis for Master of Science, Georgia Institute of Technology, 2006, 137 pp.

Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).

Maki et al., "Photocleavable Molecule for Laser Desorption Ionization Mass Spectrometry," J. Org. Chem. 72:6427-6433, 2007.

Padmanaban et al., "Application of Photodecomposable Base Concept to 193 nm Resists," Proc. of SPIE. 3999:1136-1146, 2000.

Ross et al., "Si-containing block copolymers for self-assembled nanolithography," J. Vac. Sci. Technol. B. 26 (6):2489-2494, 2008.

Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.

Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.

Ruebner et al., "A cyclodextrin dimer with a photocleavable linker as a possible carrier for the photosensitizer in photodynamic tumor therapy," PNAS. 96(26):14692-14693, 1999.

Skulski, "Organic Iodine(I, III, and V) Chemistry: 10 Years of Development at the Medical University of Warsaw, Poland," Molecules. 5:1331-1371, 2000.

Weissman et al., "Recent advances in ether dealkylation," Tetrahedron. 61:7833-7863, 2005.

Gotrik et al., "Morphology Control in Block Copolymer Films Using Mixed Solvent Vapors," ACS Nano, 6(9):8052-8059, 2012.

Hammersky et al., "Self-Diffusion of a Polystyrene-Polyisoprene Block Copolymer," Journal of Polymer Science: Part B: Polymer Physics. 34:2899-2909, 1996.

Jung et al., "Orientation-Controlled Self-Assembled Nanolithography Using a Polystyrene-Polydimethylsiloxane Block Copolymer," Nano Lett. 7(7):2046-2050, 2007.

Jung et al., "A Path to Ultranarrow Patterns Using Self-Assembled Lithography," Nano Lett. 10:1000-1005, 2010.

Postnikov et al., "Study of resolution limits due to intrinsic bias in chemically amplified photoresists," J. Vac. Sci. Technol. B. 17(6):3335-3338, 1999.

Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.

International Searching Authority, International Search Report and Written Opinion issued in corresponding International Application No. PCT/US13/40815, mailed Oct. 21, 2013, 15 pp.

Choi et al., "Square Arrays of Holes and Dots Patterned from a Linear ABC Triblock Terpolymer," ACS Nano, 6(9):8342-8348, 2012.

(56) References Cited

OTHER PUBLICATIONS

Foubert et al., "Impact of post-litho LWR smoothing processes on the post-etch patterning result," Proc. of SPIE, 7972:797213(1)-797213(10), 2011.

Tavakkoli K.G. et al., "Templating Three-Dimensional Self-Assembled Structures in Bilayer Block Copolymer Films," Science, 336:1294-1298, 2012.

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p.

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 9 pages.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

International Searching Authority, Search Report and Written Opinion issued in corresponding International Application No. PCT/US2014/016766 dated May 26, 2014, 11 pages.

International Searching Authority, Search Report and Written Opinion issued in corresponding International Application No. PCT/US2014/016776 dated May 30, 2014, 12 pages.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

International Searching Authority, Search Report and Written Opinion issued in corresponding International Application No. PCT/US2014/016760 dated Nov. 6, 2014, 11 pages.

Yu et al., "Self-assembly of polystyrene-poly(4-vinylpyridine) in deoxycholic acid melt", Polymer, Elsevier Science Publishers B.V, GB, vol. 52, No. 18, Jul. 13, 2011, pp. 3994-4000.

International Searching Authority, Search Report and Written Opinion issued in corresponding International Application No. PCT/US2014/026969 dated Jul. 16, 2014, 15 pages.

International Searching Authority, Search Report and Written Opinion issued in corresponding International Application No. PCT/US2014/027016 dated Jul. 23, 2014, 11 pages.

International Searching Authority, Search Report and Written Opinion issued in corresponding International Application No. PCT/US2014/023926 dated Jul. 25, 2014, 10 pages.

Taiwan Patent Office, Examination Opinion issued in related TW Application No. 102117111, issued May 21, 2015, 17 pp.

\* cited by examiner

TOPOGRAPHY MINIMIZATION OF NEUTRAL LAYER OVERCOATS IN DIRECTED SELF-ASSEMBLY APPLICATIONS

CROSS REFERENCE TO RELATED APPLICATION

Pursuant to 37 C.F.R. §1.78(a)(4), this application claims the benefit of and priority to prior filed Provisional Application No. 61/782,518 filed Mar. 14, 2013, which is expressly incorporated herein by reference.

FIELD OF THE INVENTION

The present invention is directed to a patterning process using directed self-assembly.

BACKGROUND OF THE INVENTION

Directed self-assembly ("DSA") processes use block copolymers to form lithographic structures, which are formed by the rearrangement of the block copolymer from a random, unordered state to a structured, ordered state. The morphology of the ordered state is variable and depends on a number of factors, including the relative molecular weight ratios of the block polymers, as well as the surrounding chemical and physical environment. Common morphologies include line-space and cylindrical, although other structures may also be used. For example, other ordered morphologies include spherical, lamellar, bicontinuousgyroid, or miktoarm star microdomains.

Two common methods used to guide self-assembly in BCP thin films are grapho-epitaxy and chemo-epitaxy. In the grapho-epitaxy method, self-organization of block copolymers is guided by pre-patterned substrates. Self-aligned lamellar BCPs can form parallel line-space patterns of different domains in topographical trenches and enhance pattern resolution by subdividing the space of topographical patterns. However, defects and line-edge roughness are easily induced in this grapho-epitaxy directed self-assembly scheme. For example, if the sidewalls are neutral, the lamellae tend to orient perpendicular to the sidewalls and will not subdivide the pitch along the desired direction.

In the chemical epitaxy method, the self-assembly of BCP domains is guided by chemical patterns having pitch dimensions commensurate with the domain size or pitch period ($L_0$) of the self-assembled BCP morphology. The affinity between the chemical patterns and at least one of the types of BCP domains results in the precise placement of the different BCP domains on respective corresponding regions of the chemical patterns, i.e., a pinning region. The affinity for the one type of domain (for example the A domains of an A-B diblock copolymer assembly) dominates the interaction of the other domain(s) (for example the B domains) with the non-patterned regions of the surface, which can be selective or non-selective (or neutral) towards the other type(s) of domains. As a result, the pattern formation in the resulting BCP assembly can directly mirror the underlying chemical pattern (i.e., can be a one-for-one reproduction of the features of the chemical pre-pattern). Moreover, depending on the domain size or pitch period ($L_0$) of the self-assembled BCP morphology and the critical dimension (CD) of the pinning regions and the non-patterned regions, frequency multiplication can be achieved. However, dimension control and line-edge roughness can be negatively affected in chemo-epitaxy methods by topographical variations in the chemical pre-pattern.

Figure 1A:
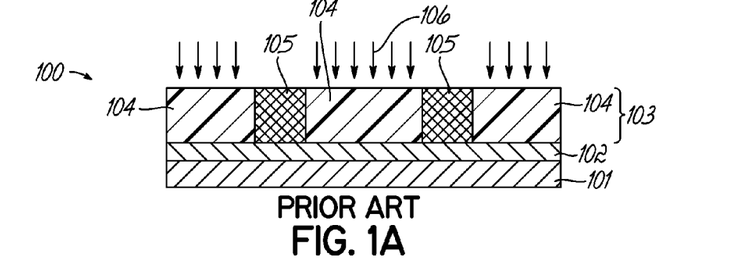
FIGS. 1A-1E illustrate a lithographic process for forming a directed self-assembly prepattern, in accordance with an embodiment of the prior art.
Figure 1B:
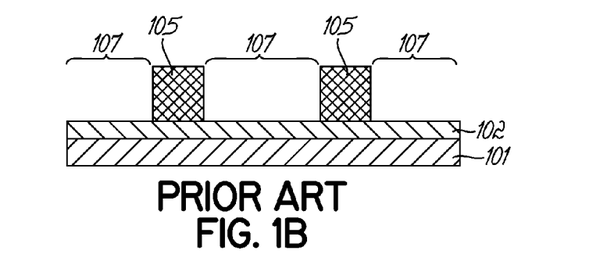
Figure 1C:
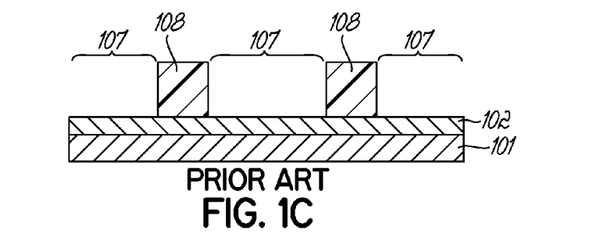
Figure 1D:
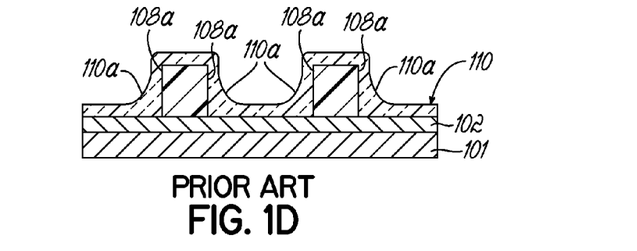
Figure 1E:
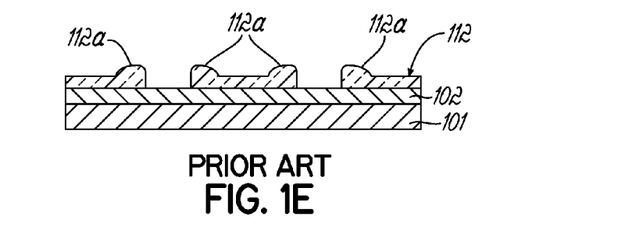
Figure 2A:
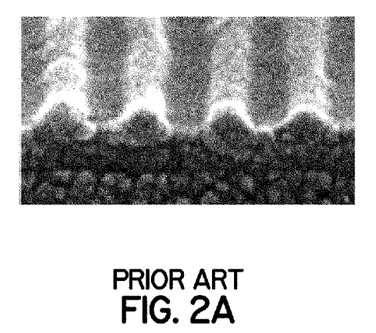
FIG. 2A is a perspective view of a prior art scanning electron micrograph (SEM) showing a neutral layer coating on a patterned photoresist layer with pooling regions against the resist lines.

One commonly observed variation in chemical pre-patterns is introduced when forming a neutral layer over the prepattern, which is not resolved in the subsequent lift-off step. Referring to FIGS. 1A-1E, a layered substrate 100 of the prior art is provided having a substrate 101 coated with an under-layer 102 and an imaged layer of photoresist 103, wherein exposed regions 104 and unexposed regions 105 are shown after exposure to radiation 106. Where the layer of photoresist 103 is a positive tone photoresist comprising a photoacid generator, exposed regions 104 are rendered soluble to positive tone developing chemistry, such as aqueous tetramethylammonium hydroxide (TMAH), upon performing a post-exposure bake. As shown in FIG. 1B, exposure of layer of photoresist 103 to a developing chemistry removes exposed regions 104 to provide openings 107. A flood exposure step shown in FIG. 1C, followed by a bake step provides positive resist lines 108. Coating the positive resist lines 108 with a thin uncross-linked neutral layer, which is subsequently baked to cross-link the thin neutral layer, forms a cross-linked neutral layer 110. However, as shown in FIG. 1D, the application of the neutral layer 110 has traditionally been plagued by pooling regions 110a of the neutral layer 110 against the sides 108a of the positive resist lines 108. These pooling regions can be seen in the scanning electron micrograph (SEM) shown in FIG. 2A.

Figure 2B:
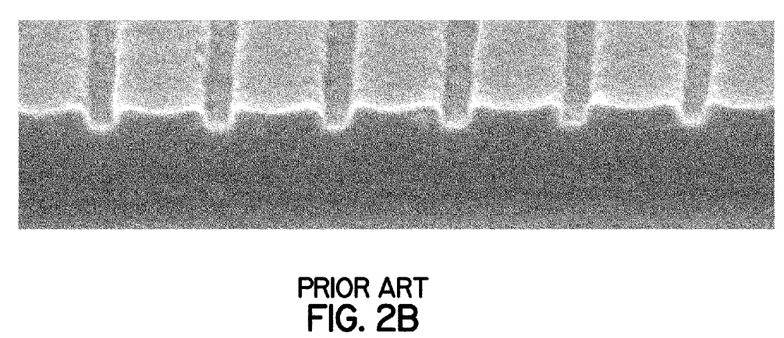
FIG. 2B is a perspective view of a prior art SEM showing a directed self-assembly prepattern after a lift off process.
Figure 2C:
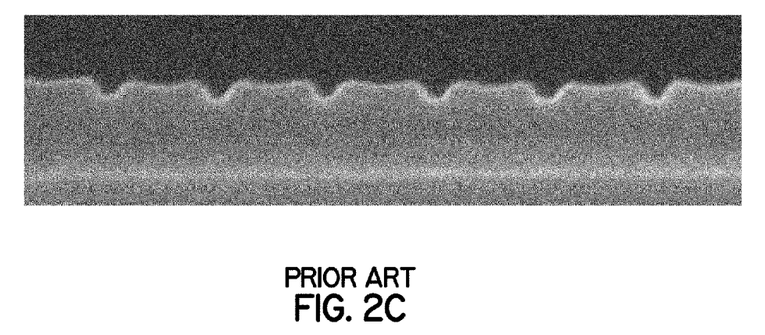
FIG. 2C is a cross-sectional view of the SEM shown in FIG. 2B.

The underlying positive tone resist lines 108 are then lifted off by exposure to a developer solution (such as a tetramethyl ammonium hydroxide (TMAH) solution), which penetrates the thin cross-linked neutral layer 110, and then dissolves the underlying positive tone resist lines 108. As the positive tone resist lines 108 dissolves, the cross-linked neutral layer 110 attached to the lines 108 is essentially lifted off the layered substrate 100 because it has lost its underlying support, i.e., the positive tone resist lines 108. Unfortunately, the pooling regions 110a of the neutral layer 110 are not removed in this subsequent developing step. Accordingly, this pre-pattern variation 112a remains in the patterned neutral layer 112. In the SEMs shown in FIGS. 2B and 2C, the retained pooling regions are prominently evident in the bulbous edges. The increased variations in neutral layer topography can lower the propensity of an overlying layer of BCP to undergo DSA, which in turn causes an increase in defects.

Therefore, due to the aforementioned limitations, methods to improve neutral layer topography would therefore be highly desirable for improved directed self-assembly processes.

SUMMARY

The present invention overcomes the foregoing problems and other shortcomings, drawbacks, and challenges of conventional prepattern formation in directed self-assembly applications. While the invention will be described in connection with certain embodiments, it will be understood that the invention is not limited to these embodiments. To the contrary, this invention includes all alternatives, modifications, and equivalents as may be included within the scope of the present invention.

According to an embodiment of the present invention, a method for patterning a layered substrate is provided. The method comprises loading a substrate into a coater-developer processing system; coating the substrate with a photoresist material to form a photoresist material layer on the substrate; patterning the photoresist material layer to form a photoresist pattern on the substrate; transferring the substrate to a deposition processing system; and depositing a neutral layer over the photoresist pattern and exposed portions of the substrate.

According to another embodiment, the method may further include hardening the photoresist pattern subsequent to patterning of the photoresist material, to render the photoresist pattern resistant to subsequent deposition of the neutral layer. According to another embodiment, the method may further include trimming the photoresist pattern subsequent to patterning of the photoresist material.

According to another embodiment of the invention, the deposition processing system may be a gas cluster ion beam (GCIB) system, and the neutral layer is deposited using GCIB deposition of gas cluster ions formed from a first gas mixture. According to another embodiment, the deposition processing system is an atomic layer deposition (ALD) system, and the neutral layer is deposited using ALD deposition utilizing at least one precursor gas.

According to yet another embodiment, the method of claim 1, may further include lifting off a portion of the neutral layer deposited over the photoresist pattern to expose a neutral layer template for subsequent directed self-assembly (DSA) patterning; depositing a DSA material layer over the neutral layer template; baking the DSA material layer to form a DSA pattern; and developing the DSA material layer to expose the final DSA pattern for subsequent feature etching.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF EMBODIMENTS OF THE INVENTION

Methods for forming a prepattern to be used with direct self-assembly ("DSA") integrations are disclosed in various embodiments. However, one skilled in the relevant art will recognize that the various embodiments may be practiced without one or more of the specific details or with other replacement and/or additional methods, materials, or components. In other instances, well-known structures, materials, or operations are not shown or described in detail to avoid obscuring aspects of various embodiments of the present invention.

Similarly, for purposes of explanation, specific numbers, materials, and configurations are set forth in order to provide a thorough understanding. Nevertheless, the embodiments of the present invention may be practiced without specific details. Furthermore, it is understood that the illustrative representations are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment.

In accordance with embodiments of the present invention, a method for patterning a layered structure includes, performing photolithography process on a track to provide a developed prepattern photoresist layer on an underlying substrate, forming a neutral layer over the developed prepatterned photoresist layer in a depositions system, lifting off a portion of the neutral layer to exposed pinning regions, casting and annealing a layer of a self-assembling block copolymer, forming a pattern by selectively removing at least a portion of one polymer block of the self-assembling block copolymer, and optionally transferring the pattern to the underlying substrate.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter, which is temperature dependent, and N is the total degree of polymerization for the block copolymer. According to embodiments of the present invention, the $\chi N$ value of one polymer block with at least one other polymer block in the larger polymer may be equal to or greater than about 10.5, at the annealing temperature.

As used herein, the term "block copolymer" means and includes a polymer composed of chains where each chain contains two or more polymer blocks as defined above and at least two of the blocks are of sufficient segregation strength (e.g. $\chi N > 10.5$) for those blocks to phase separate. A wide variety of block polymers are contemplated herein including diblock copolymers (i.e., polymers including two polymer blocks (AB)), triblock copolymers (i.e., polymers including three polymer blocks (ABA or ABC)), multiblock copolymers (i.e., polymers including more than three polymer blocks (ABCD, etc.)), and combinations thereof.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self assemble into ordered morphologies, having spherical, cylindrical, lamellar, or bicontinuous gyroid microdomains, where the molecular weight of the block copolymer dictates the sizes of the microdomains formed. The domain size or pitch period ($L_O$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure.

The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature (Tg), but below the thermal degradation temperature (Td) of the block copolymer, and also below the order-disorder temperature (ODT) above which the block copolymer will no longer phase separate. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g. organometallic-containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a diblock copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a copolymer mask are disclosed in U.S. Pat. No. 7,579,278; and U.S. Pat. No. 7,723,009, the entire disclosure of each of which is incorporated by reference herein.

According to an embodiment of the present invention, the directed self-assembly block copolymer is a block copolymer comprising a first polymer block and a second polymer block, where the first polymer block inherently has an etch selectivity greater than 2 over the second block polymer under a first set of etch conditions. According to one embodiment, the first polymer block comprises a first organic polymer, and the second polymer block comprises a second organic polymer. In another embodiment, the first polymer block is an organic polymer and the second polymer block is an organometallic-containing polymer. As used herein, the organometallic-containing polymer includes polymers comprising inorganic materials. For example, inorganic materials include, but are not limited to, metalloids such as silicon, and/or transition metals such as iron.

It will be appreciated that the total size of each block copolymer and the ratio of the constituent blocks and monomers may be chosen to facilitate self-organization and to form organized block domains having desired dimensions and periodicity. For example, it will be appreciated that a block copolymer has an intrinsic polymer length scale, the average end-to-end length of the copolymer in film, including any coiling or kinking, which governs the size of the block domains. A copolymer solution having longer copolymers may be used to form larger domains and a copolymer solution having shorter copolymers may be used to form smaller domains.

Moreover, the types of self-assembled microdomains formed by the block copolymer are readily determined by the volume fraction of the first block component to the second block components.

For example, when the volume ratio of the first block component to the second block component is greater than about 80:20, or less than about 20:80, the block copolymer will form an ordered array of spheres composed of the second polymeric block component in a matrix composed of the first polymeric block component. Conversely, when the volume ratio of the first block component to the second block component is less than about 20:80, the block copolymer will form an ordered array of spheres composed of the first polymeric block component in a matrix composed of the second polymeric block component.

When the volume ratio of the first block component to the second block component is less than about 80:20 but greater than about 65:35, the block copolymer will form an ordered array of cylinders composed of the second polymeric block component in a matrix composed of the first polymeric block component. Conversely, when the volume ratio of the first block component to the second block component is less than about 35:65 but greater than about 20:80, the block copolymer will form an ordered array of cylinders composed of the first polymeric block component in a matrix composed of the second polymeric block component.

When the volume ratio of the first block component to the second block component is less than about 65:35 but is greater than about 35:65, the block copolymer will form alternating lamellae composed of the first and second polymeric block components.

Therefore, the volume ratio of the first block component to the second block component can be readily adjusted in the block copolymer in order to form desired self-assembled periodic patterns. According to embodiments of the present invention, the volume ratio of the first block component to the second block component is less than about 65:35 but greater than about 35:65 to yield an ordered array of lamellar domains composed of alternating layers of the first polymer block component and the second polymeric block component.

Block copolymers may be comprised of exemplary organic polymer blocks that include, but are not limited to, poly(9,9-bis(6'-N,N,N-trimethylammonium)-hexyl)-fluorene phenylene) (PFP), poly(4-vinylpyridine) (4PVP), hydroxypropyl methylcellulose (HPMC), polyethylene glycol (PEG), poly (ethylene oxide)-co-poly(propylene oxide) di- or multiblock copolymers, poly(vinyl alcohol) (PVA), poly(ethylene-co-vinyl alcohol) (PEVA), poly(acrylic acid) (PAA), polylactic acid (PLA), poly(ethyloxazoline), a poly(alkylacrylate), polyacrylamide, a poly(N-alkylacrylamide), a poly(N,N-dialkylacrylamide), poly(propylene glycol) (PPG), poly(propylene oxide) (PPO), partially or fully hydrolyzed poly(vinyl alcohol), dextran, polystyrene (PS), polyethylene (PE), polypropylene (PP), polyisoprene (PI), polychloroprene (CR), a polyvinyl ether (PVE), poly(vinyl acetate) (PVAc), poly(vinyl chloride) (PVC), a polyurethane (PU), a polyacrylate, an oligosaccharide, or a polysaccharide.

Block copolymers may be comprised of exemplary organometallic-containing polymer blocks that include, but are not limited to, silicon-containing polymers such as polydimethylsiloxane (PDMS), polyhedral oligomeric silsesquioxane (POSS), or poly(trimethylsilylstyrene (PTMSS), or silicon- and iron-containing polymers such as poly (ferrocenyldimethylsilane) (PFS).

Exemplary block copolymers include, but are not limited to, diblock copolymers such as polystyrene-b-polydimethylsiloxane (PS-PDMS), poly(2-vinylpyridine)-b-polydimethylsiloxane (P2VP-PDMS), polystyrene-b-poly(ferrocenyldimethylsilane) (PS-PFS), or polystyrene-b-poly-DL-lactic acid (PS-PLA), or triblock copolymers such as polystyrene-b-poly(ferrocenyldimethylsilane)-b-poly(2-vinylpyridine) (PS-PFS-P2VP), polyisoprene-b-polystyrene-b-poly(ferrocenyldimethylsilane) (PI-PS-PFS), or polystyrene-b-poly(trimethylsilylstyrene)-b-polystyrene (PS-PTMSS-PS). In one embodiment, a PS-PTMSS-PS block copolymer comprises a poly(trimethylsilylstyrene) polymer block that is formed of two chains of PTMSS connected by a linker comprising four styrene units. Modifications of the block copolymers is also envisaged, such as that disclosed in U.S. Patent Application Publication No. 2012/0046415, the entire disclosure of which is incorporated by reference herein.

In one particular embodiment, the block copolymer used for forming the self-assembled periodic patterns is a PS-PMMA block copolymer. The polystyrene (PS) and the polymethylmethacrylate (PMMA) blocks in such a PS-PMMA block copolymer can each have a number average molecular weight ranging from about 10 kg/mol to about 100 kg/mol, with a number average molecular weight from about 20 kg/mol to about 50 kg/mole being more typical. Additionally, the volume fraction of the PMMA (fPMMA) can range from about 35% to about 65%. In one embodiment, a PS-PMMA block copolymer having a 44 kg/mol molecular weight, with 50 vol % PMMA, provides lamellar features having an 12.5 nm structure period ($L_S$) and a 25 nm pitch ($L_o$).

Embodiments of the invention may also allow for the formation of features smaller than those that may be formed by block polymers alone or photolithography alone. In embodiments of the invention, a self-assembly material formed of different chemical species is allowed to organize to form domains composed of like chemical species. Portions of those domains are selectively removed to form temporary placeholders and/or mask features. A pitch multiplication process may then be performed using the temporary placeholders and/or mask features formed from the self-assembly material. Features with a pitch smaller than a pitch of the temporary placeholders may be derived from the temporary placeholders.

However, in order to overcome the problems of the prior art and to minimize topography of the chemo-epitaxy prepattern, the method described herein utilizes new combinations of processing steps to prepare a prepatterned substrate for use in DSA applications. This method can improve the reliability of the DSA step, thereby minimizing processing defects.

Figure 4:
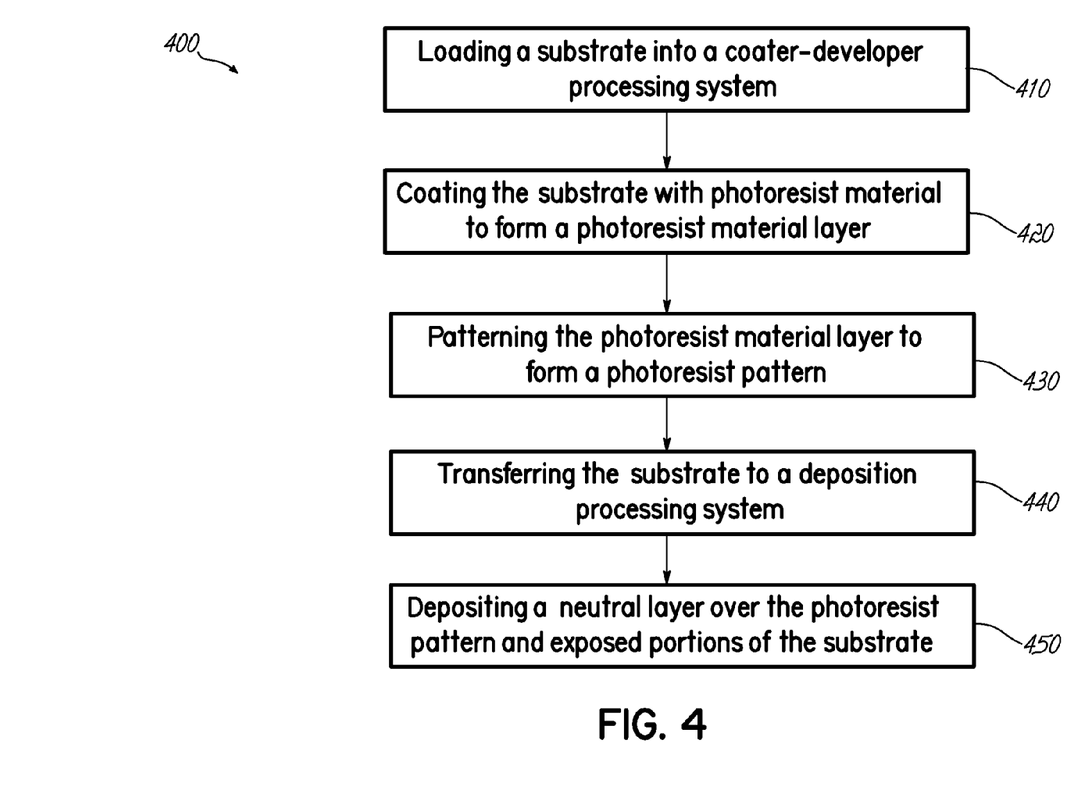
FIG. 4 is a flow chart illustrating a method of forming a DSA prepattern, in accordance with an embodiment of the present invention.

Thus, in accordance with embodiments of the present invention and in reference to FIG. 4, a method 400 for patterning a layered substrate is provided. The method 400 comprises loading a substrate into a coater-developer processing system (410); coating the substrate with a photoresist material to form a photoresist material layer on the substrate (420); patterning the photoresist material layer to form a photoresist pattern on the substrate (430); transferring the substrate to a deposition processing system (440); and depositing a neutral layer over the photoresist pattern and exposed portions of the substrate (450). As described in more detail below, the neutral layer may be deposited using 1) a gas cluster ion beam (GCIB) process or 2) an atomic layer deposition (ALD) process.

With reference to FIGS. 3A-3G and step 410, the substrate 301 is loaded into a coater-developer processing system, such as one of the units from the CLEAN TRACK® family of coaters/developers, wherein a light sensitive material, such as a photoresist, can be applied, imaged, and developed. The substrate 301 may comprise a semiconductor, e.g., mono-crystalline silicon, germanium, and any other semiconductor. In alternate embodiments, substrate 301 may comprise any material used to fabricate integrated circuits, passive microelectronic devices (e.g., capacitors, inductors) and active microelectronic devices (e.g., transistors, photo-detectors, lasers, diodes). Substrate 301 may include insulating materials that separate such active and passive microelectronic devices from a conductive layer or layers that are formed on top of them. In one embodiment, substrate 301 comprises a p-type mono-crystalline silicon substrate that includes one or more insulating layers e.g., silicon dioxide, silicon nitride, sapphire, and other insulating materials.

Figure 3A:
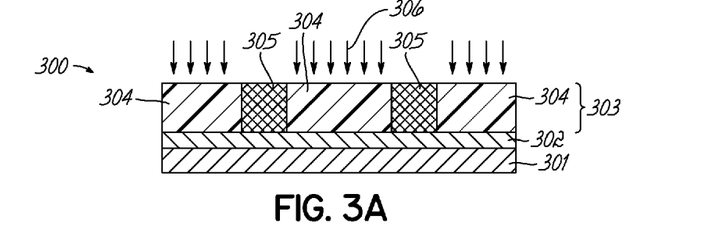
FIGS. 3A-3G illustrate a lithographic process for forming a DSA prepattern, in accordance with an embodiment of the present invention.

The substrate 301 may comprise a film stack having one or more thin films or layers 302 disposed on a base layer. In one embodiment, the layer 302 may be an organic layer, such as an organic polymer-based anti-reflective coating (ARC). In another embodiment, the layer 302 may be an inorganic-based layer, such as a silicon ARC. According to another embodiment, the material utilized in forming layer 302 may be selected based on its chemical affinity for the one type of domain (for example the A domains of an A-B diblock copolymer assembly).

A solution of a photoresist material can be spin-coated or spray-coated onto the substrate, and then baked to remove the casting solvent to form a photoresist material layer on the layered substrate 300. As shown in FIG. 3A and in Step 430, patterning the photoresist material layer with radiation 306 forms a patterned photoresist layer 303 having exposed regions 304 and unexposed regions 305 on the substrate 301). Depending on the nature of the resist, the subsequent development step can be negative tone, where the unexposed regions 305 are removed, or positive tone, where the exposed regions 304 are removed. In the embodiment shown in FIG. 3B, a positive tone development has been performed to remove exposed regions 304 and thereby provide openings 307 and resist lines 305. Depending on the chemical composition of the photoresist material comprising the resist lines 305, it is further contemplated that the prepatterned substrate can undergo further processing prior to deposition of the neutral layer. For example, the patterned photoresist layer of the prepatterned substrate can be trimmed. Exemplary methods for trimming, which is also commonly referred to as slimming, are described in U.S. Pat. Nos. 8,338,086 and 8,435,728, the entire contents of these patent documents are herein incorporated by reference in their entirety.

Figure 3B:
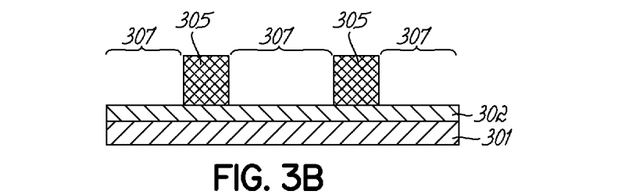

In accordance with embodiments of the present invention, the resist lines 305, which will be subsequently removed in a lift-off step described in more detail below, may have certain favorable properties. For example, the resist lines 305 may be compatible with the neutral layer deposition process. However, the compatibility of a photoresist material in a neutral layer deposition process is dependent upon the nature of the photoresist material, the deposition process, i.e., whether it is a GCIB or an ALD process, and the processing conditions. Accordingly, hardening the photoresist pattern subsequent to patterning can render the photoresist pattern resistant to degradation during the subsequent deposition of the neutral layer.

Another property of the resist lines 305 to consider is that the resist lines may be dissolvable in a processing liquid used in the subsequent lift-off process. For example, where the photoresist material is a positive tone photoresist comprising a protected polymer and a photoacid generator, a flood exposure step, followed by a bake step would render the resist lines soluble to aqueous basic solutions, such as tetramethyl ammonium hydroxide (TMAH) solutions. Thus, in the embodiment shown in FIGS. 3B-3C, resist lines 305 comprising a protected photoresist polymer, are converted to resist lines 308, comprising a deprotected photoresist polymer by a flood exposure and a post-exposure bake to provide a prepatterned substrate that is ready for application of a neutral layer, and subsequent dissolution in a processing liquid during the liftoff process. According to another example, where the photoresist material is a negative tone photoresist developed with organic solvent, the resist lines 305 possess the proper polarity to not be dissolvable in a casting solvent for the subsequent neutral layer coating, and solvable in a processing liquid used in the lift-off process. As such, a flood exposure and a bake step are not necessary.

Thus, in accordance with an embodiment, where the photoresist is a positive tone resist, the layered substrate comprising the patterned positive tone photoresist layer may be exposed to processing conditions prior to deposition of the neutral layer, where the conditions are sufficient to change the polarity of the photoresist material to render it soluble or more soluble to the lift-off processing liquid. Exemplary processes include, but are not limited, exposure and post-exposure bake, acid wash and post-acid wash bake, or heating the photoresist material to a temperature sufficient to induce thermal degradation. In a complementary embodiment, where the photoresist is a negative tone resist, additional processing steps prior to depositing the neutral layer may be omitted.

A. Gas Cluster Ion Beam Processor

Figure 3C:
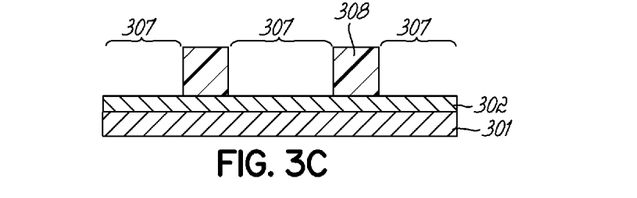

The prepatterned substrate shown in FIG. 3C may be transferred to a deposition processing system. In accordance with an embodiment, the deposition processing system in a GCIB processing system. Exemplary, but non-limiting examples of suitable GCIB processing systems are described in U.S. Pat. Nos. 8,097,860 and 7,794,798, and U.S. Patent Application Publication No. 2010/0193701, the entire contents of these patent documents are incorporated herein by reference in their entirety. The basic operating principle for GCIB is that coating is formed when a surface is bombarded by a beam of high energy, nanoscale cluster ions. The clusters are formed when a high pressure gas (approximately 10 atmospheres pressure) expands into a substantially lower pressure vacuum through a properly shaped nozzle. The gas expands adiabatically and cools then condenses into clusters.

The clusters are nano sized bits of crystalline matter with unique properties intermediate between the realms of atomic physics and those of solid state physics. The expansion takes place inside of a nozzle that shapes the gas flow and facilitates the formation of a jet of clusters. The jet of clusters passes through differential pumping apertures into a region of high vacuum ($1 \times 10^{-8}$ atmospheres) where the clusters are ionized by collisions with energetic electrons. The ionized clusters are accelerated electrostatically to very high velocities, and are focused into a tight beam.

Figure 3D:
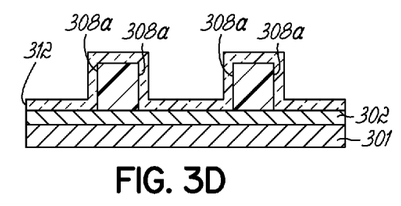
Figure 3E:
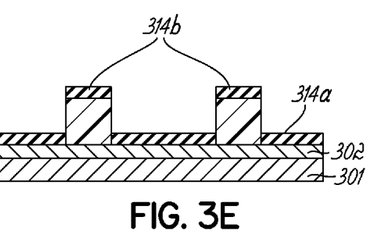
Figure 3F:
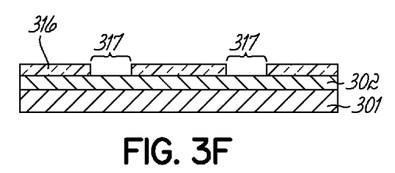
Figure 3G:
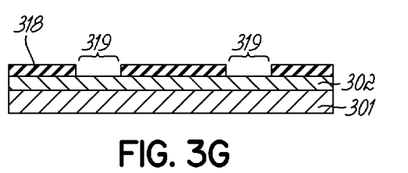

Depending on various operating parameters, such as the number of nozzles, relative orientation of the layered substrate to the nozzle(s), etc., the GCIB deposition can applied in a manner to uniformly or non-uniformly coat the topography of a prepatterned substrate. For example, as shown in FIG. 3D, a uniformly applied neutral layer 312 can formed, such that the vertical surfaces 308a of resist lines 308 are also coated with the neutral material. In an alternative embodiment shown in FIG. 3E, a neutral layer can be applied selectively to horizontal surfaces for form neutral layer 314a in the openings 307, and neutral layer 314b on the horizontal surface of resist lines 308. As such, the vertical surfaces 308a of the resist lines 308 remain uncoated. In either embodiment, the pooling of the neutral layer material against the resist lines 308 is substantially minimized or eliminated.

Thus, in accordance with this embodiment, a neutral layer is deposited using a GCIB deposition of gas cluster ions formed from a first gas mixture, which may comprise a silicon-containing gas, a carbon-containing gas, an oxygen-containing gas, a hydrogen-containing gas, or combinations thereof. As noted above, the neutral layer can be selected base on its chemical properties toward one or more blocks of the BCP in the subsequent DSA patterning. Accordingly, the first gas mixture may be tuned to set the chemical properties of the neutral layer.

When producing silicon-containing films, the silicon-containing species can include silane ($SiH_4$), disilane ($Si_2H_6$), dichlorosilane ($SiH_2Cl_2$), trichlorosilane ($SiCl_3H$), diethylsilane ($C_4H_{12}Si$), trimethylsilane ($C_3H_{10}Si$), silicon tetrachloride ($SiCl_4$), silicon tetrafluoride ($SiF_4$), or a combination of two or more thereof.

When producing silicon-containing films, other species of the pressurized gas mixture can include a carbon-containing material, an oxygen-containing material, a hydrogen-containing material, or a combination of two or more thereof. For example, the pressurized gas mixture can further include $N_2$, $NH_3$, $NF_3$, $NO$, $N_2O$, $NO_2$, a hydrocarbon gas having the formula $C_xH_y$, wherein x and y are integers greater than or equal to unity, a fluorocarbon gas having the formula $C_xF_y$, wherein x and y are integers greater than or equal to unity, a hydrofluorocarbon gas having the formula $C_xH_yF_z$, wherein x, y and z are integers greater than or equal to unity, $H_2$, $O_2$, $CO$, $CO_2$, or a noble gas, or a combination of two or more thereof.

According to one example, a film containing Si is deposited using the introduction of silane ($SiH_4$) to a GCIB.

According to another example, a film containing Si and O is deposited using the introduction of silicon tetrafluoride ($SiF_4$), and an oxygen-containing gas such as $O_2$ to a GCIB.

According to another example, a film containing Si and C is deposited using the introduction of silane ($SiH_4$), and a hydrocarbon gas ($C_xH_y$) such as methane ($CH_4$) to a GCIB. Alternatively, the introduction of diethylsilane or trimethylsilane to a GCIB can be utilized.

According to another example, a film containing Si, H and C is deposited using the introduction of silane ($SiH_4$), and a hydrocarbon gas ($C_xH_y$) such as methane ($CH_4$) to a GCIB. Alternatively, the introduction of diethylsilane or trimethylsilane to a GCIB can be utilized.

According to another example, a film containing Si, O and C is deposited using the introduction of silicon tetrafluoride ($SiF_4$), an oxygen-containing gas such as $O_2$, and methane ($CH_4$) to a GCIB. Alternatively, other carbon-containing gases may include CO and $CO_2$.

For example, for organic lamellar block copolymers (e.g., polystyrene-b-poly(methyl methacrylate), or PS-b-PMMA), depositing films with various ratios of C, H, and O can change the hydrophobicity of the neutral layer. For example, increasing oxygen content in the neutral layer film, increases the hydrophilicity of the neutral layer. Conversely, a low oxygen content will produce a more hydrophobic neutral layer. For silicon-containing high χ materials, silicon oxide, silicon nitride, silicon oxynitride, and carbide films with various ratios would cover a range of surface energies.

Depending on various operating parameters, such as the number of nozzles, relative orientation of the layered substrate to the nozzle(s), etc., the GCIB deposition can applied in a manner to uniformly or non-uniformly coat the topography of a prepatterned substrate. For example, as shown in FIG. 3D, a uniformly applied neutral layer 312 can formed, such that the vertical surfaces 308a of resist lines 308 are also coated with the neutral material. In an alternative embodiment shown in FIG. 3E, a neutral layer can be applied selectively to horizontal surfaces for form neutral layer 314a in the openings 307, and neutral layer 314b on the horizontal surface of resist lines 308. As such, the vertical surfaces 308a of the resist lines 308 remain uncoated. In either embodiment, the pooling of the neutral layer material against the resist lines 308 is substantially minimized or eliminated.

The substrate can be positioned on a substrate holder and may be securely held by the substrate holder. The temperature of the substrate may or may not be controlled. For example, the substrate may be heated or cooled during a film forming process. The environment surrounding the substrate is maintained at a reduced pressure, while a GCIB is formed from a pressurized gas mixture comprising one or more film-forming species. As described above, a pressurized gas mixture is expanded into a reduced pressure environment to form gas-clusters, the gas-clusters are ionized, and the ionized gas-clusters are accelerated and optionally filtered.

According to an embodiment, a GCIB is utilized to selectively deposit material on only chosen surfaces of a substrate. For example, the GCIB can be provided by orienting the substrate relative to the direction of incidence of the GCIB, material deposition can proceed on one or more surfaces that are substantially perpendicular to the incident GCIB while material deposition can be substantially avoided or reduced on one or more surfaces that are substantially parallel with the incident GCIB. Thus, in accordance with an embodiment, the neutral layer may be anisotropically deposited using GCIB deposition of gas cluster ions.

Accordingly, subsequently adjusting the orientation of the substrate relative to the direction of incidence of the GCIB or utilizing an array of angled GCIB nozzles will then permit deposition to proceed on other surfaces that are then oriented substantially perpendicular to the incident GCIB. Moreover, one or more other properties of the GCIB, including the beam composition, can be adjusted or alternated in order to directionally deposit successive material films having differing properties from one layer to an adjacent layer on one or more surfaces substantially perpendicular to the incident GCIB.

B. Atomic Layer Deposition Processor

In accordance with another embodiment of the present invention, the prepatterned substrate is transferred to an atomic layer deposition (ALD) processing system. Exemplary, but non-limiting examples of suitable ALD processing systems are described in U.S. Patent Application Publication Nos. 2007/0037412, 2007/0237697, and 2005/0056219, the entire contents of these patent documents are herein incorporated by reference in their entirety.

ALD is a self-limiting (the amount of film material deposited in each reaction cycle is constant), sequential surface chemistry that deposits conformal thin-films of materials onto substrates of varying compositions. Due to the characteristics of self-limiting and surface reactions, ALD film growth makes atomic scale deposition control possible. ALD is similar in chemistry to chemical vapor deposition (CVD), except that in one embodiment, ALD reaction breaks the CVD reaction into two half-reactions, keeping the precursor materials separate during the reaction. By keeping the precursors separate throughout the coating process, atomic layer control of film growth can be obtained as fine as about 0.1 angstroms per cycle. Separation of the precursors is accomplished by pulsing a purge gas (typically nitrogen or argon) after each precursor pulse to remove excess precursor from the process chamber and prevent parasitic or unintentional CVD deposition on the substrate. ALD is typically used to deposit thin films such as silicon oxides, silicon nitrides, silicon oxynitrides, and carbide films. However, the process is not specifically limited thereto. Moreover, the ALD deposition process may be implemented as a batch process or in a single wafer process.

Thus, in accordance with this embodiment, a neutral layer is deposited using an ALD deposition a first precursor gas, which may comprise a silicon-containing gas, a carbon-containing gas, an oxygen-containing gas, a hydrogen-containing gas, or combinations thereof. The reaction chamber can be purged or evacuated to remove the non-reacted first precursor gas, followed by exposure of the substrate to a second precursor gas, which is again followed by purging or evacuation of the reaction chamber. Accordingly, the ALD process can isotropically deposit the neutral layer over the prepatterned photoresist layer.

The silicon-containing gas or silicon precursors can include silanes, alkylsilanes, alkylaminosilanes, silanols, and alkoxy silanes. For example, silicon precursors include, but are not limited to, $(Me_2N)_4Si$, $(Me_2N)_3SiH$, $(Me_2N)_2SiH_2$, $(Me_2N)SiH_3$, $(Et_2N)_4Si$, $(Et_2N)_3SiH$, $(MeEtN)_4Si$, $(MeEtN)_3SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSiH_3$, $Me_2SiH_2$, $EtSiH_3$, $Et_2SiH_2$, $MeSi(OH)_3$, $Me_2Si(OH)_2$, $(EtO)_4Si$, derivative thereof, and combinations thereof. Other alkoxy silanes may be described by the generic chemical formula $(RO)_{4-n}SiL_n$, where n=0-3, R=methyl, ethyl, propyl, or butyl and L=H, OH, F, Cl, Br, or I, and combinations thereof. Other alkylsilane compounds useful as silicon precursors include $R_{4-n}SiH_n$, where R is independently methyl, ethyl, propyl, butyl, or other alkyl and n=0-3. Other alkylaminosilane compounds useful as silicon precursors include $(RR'N)_{4-n}SiHn$, where R or R' are independently hydrogen, methyl, ethyl, propyl, or butyl and n=0-3. Also, higher silanes are used as silicon precursors within some embodiments of the invention. Higher silanes are disclosed in U.S. Patent Application Publication No. 2004/0224089, which is incorporated herein by reference in entirety for the purpose of describing silicon precursors. In one embodiment, silicon precursors include $(Me_2N)_3SiH$, $(Et_2N)_3SiH$, $(Me_2N)_4Si$, $(Et_2N)_4Si$, and $(MeEtN)_4Si$. Optionally an inert gas such as Ar may be also be included in the silicon-containing gas.

The carbon-containing gas or carbon precursor can include, but is not limited to, CO, $CO_2$, $H_2CO$, $C_xH_y$, $C_xF_y$, $C_xH_yN_z$, or a combination thereof, where x, y, and z are integers, and optionally an inert gas such as Ar.

The oxygen-containing gas or oxygen precursor can include, but is not limited to, $O_2$, $H_2O$, $H_2O_2$, NO, $NO_2$, $N_2O$, ozone, or plasma excited oxygen, or a combination thereof, and optionally an inert gas such as Ar.

In order to incorporate oxygen and carbon into the neutral layer film, a combination of at least one gas pulse containing oxygen and at least one gas pulse containing carbon may be utilized. Of course, gases that include CO, $CO_2$, or $H_2CO$, contain both oxygen and carbon.

According an embodiment, an ALD deposition process flow for depositing the neutral layer includes a deposition cycle containing sequential and alternating exposures of a pulse of a first gas precursor, a pulse of a purge gas, a pulse of a second gas precursor, a pulse of a purge gas, a pulse of a third gas precursor, a pulse of a purge gas, etc. and the cycle may be repeated. According to another embodiment of the invention, the order of the sequential and alternating exposure of the first, second, third, etc. gas precursors of the deposition cycle be reversed or varied in different orders and frequency to effect the desired film growth and film composition. Furthermore, according to embodiments of the invention, each of the sequential exposure to the precursor gases may be independently repeated a predetermined number of times. As those skilled in the art will readily recognize, a wide variety of other deposition cycles are possible. For example, where only two gas precursors are used, exemplary deposition cycles may include, for example, ABBABB, AABAAB, ABBB, AAAB, AABB, AAABB, etc. In another example, where three gas precursors are used, exemplary deposition cycles may include, but are not limited to ABCABCABC, AABBCC, ABABCBCBACAC, etc. However, embodiments of the invention are not limited to these deposition cycles, as other combinations of A, B, C, etc. may be utilized. Using these different deposition cycles, it is possible to deposit neutral layer films containing different amounts and different depth profiles of the Si, C, O, and/or H in the resulting neutral layer films.

As noted above, the neutral layer can be selected base on its chemical properties toward one or more blocks of the BCP in the subsequent DSA patterning. Accordingly, the first precursor may be tuned to set the chemical properties of the neutral layer. However, as the ALD deposition is principally a conformal application of alternating reactive layers of two complementary reactant precursors, the ALD is particularly suited for the embodiment shown in FIG. 3D, wherein a uniformly applied neutral layer 312 can formed, such that the vertical surfaces 308a of resist lines 308 are also coated with the neutral material. Accordingly, the ALD deposition method substantially minimizes or eliminates the pooling of the neutral layer material against the resist lines 308. As such, the topography variations induced by spin coating neutral layers are avoided, which in turn improves subsequent self-assembly processes.

Figure 5:
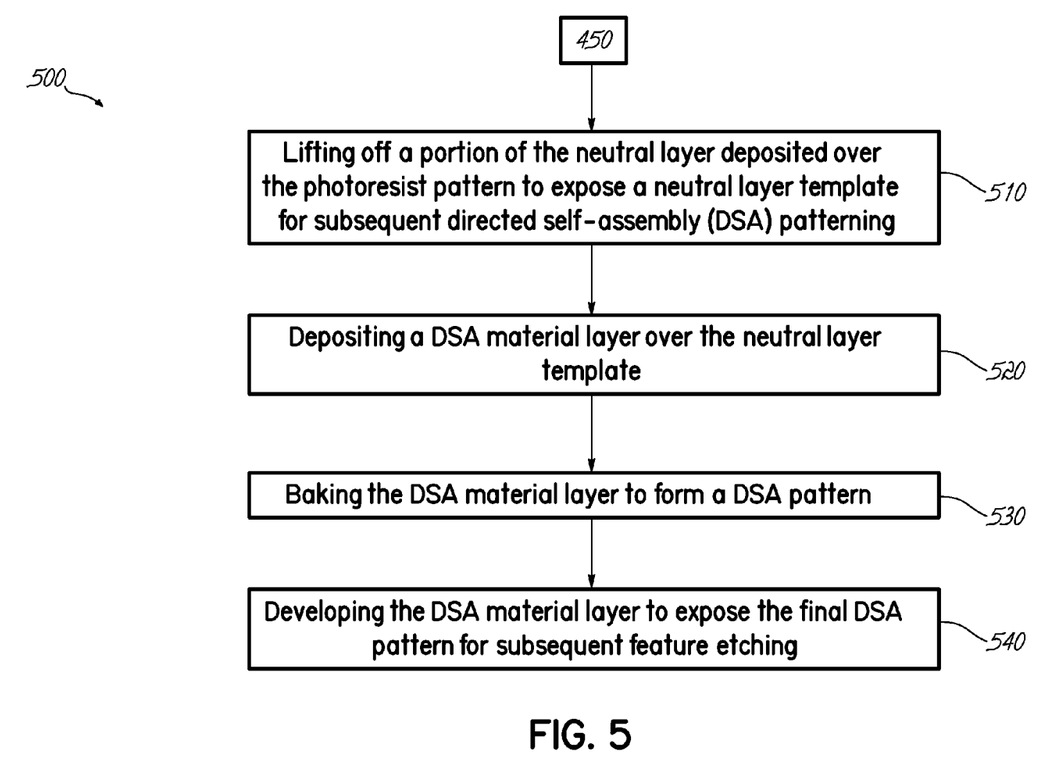
FIG. 5 is a flow chart illustrating a method of forming a DSA prepattern, in accordance with another embodiment of the present invention.

As shown in FIG. 5, the method for patterning the layered substrate further includes lifting off a portion of the neutral layer deposited over the photoresist pattern to expose a neutral layer template for subsequent directed self-assembly (DSA) patterning (510); depositing a DSA material layer over the neutral layer template (520); baking the DSA material layer to form a DSA pattern (530); and developing the DSA material layer to expose the final DSA pattern for subsequent feature etching (540).

With respect to step 510, portions of the neutral layer can be removed using a tetramethyl ammonium hydroxide (TMAH) developer or according to the method described in a unpublished patent application entitled "TRACK PROCESSING TO REMOVE ORGANIC FILMS IN DIRECTED SELF-ASSEMBLY CHEMO-EPITAXY APPLICATIONS," which is filed on the same date as the instant application.

With respect to step 520, the DSA material comprising a BCP may be deposited by various methods, including, e.g., spin-on coating, spin casting, brush coating or vapor deposition. For example, the block copolymer may be provided as a solution in a carrier solvent such as an organic solvent, e.g., toluene. The solution of the block copolymer can be applied to the layered substrate shown in FIG. 3F or 3G and the carrier solvent subsequently removed.

While the invention is not bound by theory, it will be appreciated that the different block species are understood to self-aggregate due to thermodynamic considerations in a process similar to the phase separation of materials. The self-organization is guided by the exposed regions 317 or 319 in FIG. 3F or 3G, respectively. As generally described above, one of the blocks of the BCP may have a chemical affinity for the exposed underlying layer 302, which thereby induces one of the domains of the self-assembled BCP to be pinned to this opening 317 or 319. Although not shown, the critical dimension of the opening 317, 319, as well as the critical dimension of the remaining neutral layer portions 316, 318 are important for proper alignment of the self-assembled BCP, as well as pitch multiplication.

With reference to step 530, the film of the block copolymer is exposed to annealing (baking) conditions to facilitate the self-assembly of the block copolymer. The temperature of the annealing process may be chosen to be sufficiently low to prevent adversely affecting the block copolymers or the layered substrate 300. The anneal may be performed at a temperature of less than about 350° C., less than about 300° C., less than about 250° C., less than about 200° C. or about 180° C. in some embodiments.

According to another embodiment, the annealing process may include a solvent anneal, which generally reduces the annealing temperature. The annealing process may also be used to cause cross-linking of the copolymers, thereby stabilizing the copolymers for later etching and pattern transfer steps.

According to one aspect, in order to facilitate faster annealing times without oxidizing or burning the organic polymer block of the block copolymer, the annealing may be performed in a low oxygen atmosphere at annealing temperature greater than about 250° C. in less than about 1 hour of anneal time. As used herein, the low oxygen atmosphere comprises less than about 50 ppm oxygen. For example, the low oxygen atmosphere may include less than about 45 ppm, less than about 40 ppm, less than about 35 ppm, less than about 30 ppm, less than about 25 ppm, less than about 20 ppm, or ranges in between thereof.

The anneal time may range from about several hours to about 1 minute. For example, annealing times for temperatures above 250° C. may range from about 1 hour to about 2 minutes, from about 30 minutes to about 2 minutes, or from about 5 minutes to about 2 minutes.

According to one embodiment, the annealing temperature may be within the range from about 220° C. to about 350° C., wherein the low oxygen atmosphere comprises less than about 50 ppm oxygen. For example, the block copolymer film may be exposed to annealing conditions of 310° C. in less than about 40 ppm oxygen for about a 2 minutes to about 5 minutes.

With reference to step 540, after completion of the annealing step of the film of block copolymer, a layer of self-assembled block polymer having distinct domains is formed. It will be appreciated that one of the domains may be selectively removed in a single step using a single etch chemistry or may be removed using multiple etches with different etch chemistries to provide a pattern defined by the remaining domain. For example, where a self-assembled block copolymer of polystyrene (PS)-b-polymethylmethacrylate (PMMA), the PMMA domains may be removed by performing a selective oxygen plasma etch, leaving behind a patterned substrate with PS lines.

The final DSA-derived pattern may be transferred to the underlying substrate 301. The pattern transfer may be accomplished using etch chemistries appropriate for selectively etching the material or materials of the substrate 301 relative to the remaining unetched domain features.

It will be appreciated that various modifications of the illustrated embodiments are possible. For example, while discussed in the context of diblock copolymers for ease of illustration and discussion, the copolymers may be formed of two or more block species. In addition, while the block species of the illustrated embodiment are each formed of a different monomer, the block species may share monomer(s). For example, the block species may be formed of different sets of monomers, some of which are the same, or may be formed of the same monomer, but in a different distribution in each block. The different sets of monomers form blocks having different properties which may drive the self-assembly of the copolymers.

In addition, while the illustrated embodiments may be applied to fabricate integrated circuits, embodiments of the invention may be applied in various other applications where the formation of patterns with very small features is desired. For example, embodiments of the invention may be applied to form gratings, disk drives, storage media or templates or masks for other lithography techniques, including X-ray or imprint lithography. For example, phase shift photomasks may be formed by patterning a substrate that has a film stack having phase shifting material coatings.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for patterning a layered substrate, comprising:
   loading a substrate into a coater-developer processing system;
   coating the substrate with a photoresist material to form a photoresist material layer on the substrate;
   patterning the photoresist material layer to form a photoresist pattern on the substrate;
   transferring the substrate to a deposition processing system; and
   depositing a neutral layer over the photoresist pattern and exposed portions of the substrate, wherein the deposition processing system is a gas cluster ion beam (GCIB) system, the neutral layer is deposited using GCIB deposition of gas cluster ions formed from a first gas mixture, and the first gas mixture is tuned to set the chemical properties of the neutral layer for subsequent directed self-assembly (DSA) patterning.

2. The method of claim 1, wherein the neutral layer is anisotropically deposited over the photoresist pattern and exposed portions of the substrate.

3. The method of claim 1, wherein the first gas mixture comprises at least one C-containing gas.

4. The method of claim 1, wherein the first gas mixture comprises at least one O-containing gas.

5. The method of claim 1, wherein the first gas mixture comprises at least one H-containing gas.

6. The method of claim 1, wherein the first gas mixture comprises at least one Si-containing gas.

7. The method of claim 1, further comprising:
   trimming the photoresist pattern subsequent to patterning of the photoresist material.

8. The method of claim 1, further comprising:
   hardening the photoresist pattern subsequent to patterning of the photoresist material, to render the photoresist pattern resistant to subsequent deposition of the neutral layer.

9. A method for patterning a layered substrate, comprising:
   loading a substrate into a coater-developer processing system;
   coating the substrate with a photoresist material to form a photoresist material layer on the substrate;

patterning the photoresist material layer to form a photoresist pattern on the substrate;

transferring the substrate to a deposition processing system;

depositing a neutral layer over the photoresist pattern and exposed portions of the substrate;

lifting off a portion of the neutral layer deposited over the photoresist pattern to expose a neutral layer template for subsequent directed self-assembly (DSA) patterning;

depositing a DSA material layer over the neutral layer template;

baking the DSA material layer to form a DSA pattern; and developing the DSA material layer to expose the final DSA pattern for subsequent feature etching.

10. The method of claim 9, wherein the deposition processing system is an atomic layer deposition (ALD) system, and the neutral layer is deposited using ALD deposition utilizing at least one precursor gas.

11. The method of claim 10, wherein the neutral layer is isotropically deposited over the photoresist pattern and exposed portions of the substrate.

12. The method of claim 10, wherein the at least one precursor gas comprises a C-containing gas.

13. The method of claim 10, wherein the at least one precursor gas comprises a H-containing gas.

14. The method of claim 10, wherein the at least one precursor gas comprises an O-containing gas.

15. The method of claim 10, wherein the at least one precursor gas comprises a Si-containing gas.

16. A method for patterning a layered substrate, comprising:

loading a substrate into a coater-developer processing system;

coating the substrate with a photoresist material to form a photoresist material layer on the substrate;

patterning the photoresist material layer to form a photoresist pattern on the substrate;

transferring the substrate to a deposition processing system; and depositing a neutral layer over the photoresist pattern and exposed portions of the substrate, wherein the deposition processing system is an atomic layer deposition (ALD) system, the neutral layer is deposited using ALD deposition utilizing at least one precursor gas, and the at least one precursor gas is tuned to set the chemical properties of the neutral layer for subsequent directed self-assembly (DSA) patterning.

17. The method of claim 16, wherein the neutral layer is isotropically deposited over the photoresist pattern and exposed portions of the substrate.

18. The method of claim 16, wherein the at least one precursor gas comprises a C-containing gas, a H-containing gas, an O-containing gas, or a Si-containing gas.

19. The method of claim 16, further comprising:
trimming the photoresist pattern subsequent to patterning of the photoresist material.

20. The method of claim 16, further comprising:
hardening the photoresist pattern subsequent to patterning of the photoresist material, to render the photoresist pattern resistant to subsequent deposition of the neutral layer.

* * * * *